(12) United States Patent
Zhou (10) Patent No.: US 10,763,259 B2
(45) Date of Patent: Sep. 1, 2020

(54) SEMICONDUCTOR DEVICE MANUFACTURING METHOD

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Fei Zhou, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 16/020,703

(22) Filed: Jun. 27, 2018

(65) Prior Publication Data

US 2019/0006361 A1 Jan. 3, 2019

(30) Foreign Application Priority Data

Jun. 29, 2017 (CN) .......................... 2017 1 0512418

(51) Int. Cl.
  *H01L 27/20* (2006.01)
  *H01L 29/78* (2006.01)
  (Continued)

(52) U.S. Cl.
  CPC .......... *H01L 27/0924* (2013.01); *H01L 21/22* (2013.01); *H01L 21/823821* (2013.01);
  (Continued)

(58) Field of Classification Search
  CPC ....... H01L 21/823821; H01L 29/66803; H01L 27/0924; H01L 29/66795;
  (Continued)

(56) References Cited

U.S. PATENT DOCUMENTS 9,514,995 B1 * 12/2016 Fogel .............. H01L 21/823878
9,881,918 B1 *  1/2018 Huang ................ H01L 27/0886
(Continued)

FOREIGN PATENT DOCUMENTS

CN       1383195 A    12/2002
CN     102097465 A     6/2011
(Continued)

*Primary Examiner* — Bradley Smith
*Assistant Examiner* — David J Goodwin
(74) *Attorney, Agent, or Firm* — Innovation Counsel LLP (57) ABSTRACT

A semiconductor device manufacturing method is presented. The manufacturing method includes providing a semiconductor structure, comprising: a substrate, a plurality of semiconductor fins comprising a first semiconductor fin and a second semiconductor fin on the substrate, a plurality of trenches surrounding the semiconductor fins, and a first insulation layer filling the trenches; conducting a first doping process in the first semiconductor fin to form a first anti-punch-through region therein; removing at least a portion of the first insulation layer from the trenches; forming a second insulation layer filling a portion of the trenches not filled by the first insulation layer; and conducting a second doping process in the second semiconductor fin to form a second anti-punch-through region therein. This inventive concept reduces the chance of a dopant in the first doping process diffusing into the second semiconductor fin.

15 Claims, 11 Drawing Sheets

(51) Int. Cl.
*H01L 21/266* (2006.01)
*H01L 27/092* (2006.01)
*H01L 29/06* (2006.01)
*H01L 21/22* (2006.01)
*H01L 29/66* (2006.01)
*H01L 29/417* (2006.01)
*H01L 21/8238* (2006.01)

(52) U.S. Cl.
CPC .... *H01L 29/0649* (2013.01); *H01L 29/41791* (2013.01); *H01L 29/66795* (2013.01); *H01L 29/66803* (2013.01); *H01L 29/7855* (2013.01)

(58) Field of Classification Search
CPC ......... H01L 21/823807; H01L 29/1083; H01L 21/823892; H01L 29/785; H01L 29/7851; H01L 21/823878; H01L 29/0649
See application file for complete search history.

(56) References Cited

U.S. PATENT DOCUMENTS

| | | | | |
|---|---|---|---|---|
| 9,984,939 | B2* | 5/2018 | Zhou | H01L 21/26513 |
| 2015/0044829 | A1* | 2/2015 | Kim | H01L 21/823807 |
| | | | | 438/199 |
| 2016/0218199 | A1* | 7/2016 | Tsai | H01L 29/66803 |
| 2017/0117188 | A1* | 4/2017 | Zhou | H01L 21/823821 |
| 2017/0154962 | A1* | 6/2017 | Zhou | H01L 21/76224 |
| 2017/0221908 | A1* | 8/2017 | Zhou | H01L 21/02271 |
| 2018/0122896 | A1* | 5/2018 | Zhou | H01L 21/02164 |
| 2018/0337268 | A1* | 11/2018 | Zhou | H01L 29/66803 |
| 2019/0067419 | A1* | 2/2019 | Zhou | H01L 29/1083 |
| 2019/0221908 | A1* | 7/2019 | Brown | H01M 2/36 |

FOREIGN PATENT DOCUMENTS

| | | |
|---|---|---|
| CN | 106033757 A | 10/2016 |
| CN | 106158962 A | 11/2016 |

* cited by examiner

SEMICONDUCTOR DEVICE MANUFACTURING METHOD

CROSS-REFERENCE TO RELATED APPLICATION

This application claims priority to and benefit of Chinese Patent Application No. 201710512418.4 filed on Jun. 29, 2017, which is incorporated herein by reference in its entirety.

BACKGROUND (a) Field of the Invention

This inventive concept relates to semiconductor technology and, more specifically, to a semiconductor device manufacturing method.

(b) Description of the Related Art

The Short Channel Effect (SCE) is becoming a more critical problem for a Metal Oxide Semiconductor Field Effect Transistor (MOSFET) device with its ever decreasing sizes. Fin Field Effect Transistor (FinFET) has a good gate control over channel charges, therefore can further reduce the size of a Complementary Metal Oxide Semiconductor (CMOS) device.

Conventionally, an anti-punch-through ion implantation need to be conducted to form an anti-punch-through region in semiconductor fins to prevent the punch through between a source and a drain of a FinFET device. For a N-type Metal-Oxide-Semiconductor (NMOS) device, the anti-punch-through ion implantation involves implanting boron-containing ions into the semiconductor fins, and during this process, some boron-containing ions may be implanted into a Shallow Trench Isolation (STI). For a NMOS device, the anti-punch-through ion implantation is typically implanted in a deeper location than that for a P-type Metal-Oxide-Semiconductor (PMOS) device. As a result, some boron-containing ions implanted into the STI may diffuse into nearby PMOS semiconductor fins. After an annealing treatment, the boron-containing ions doped into the PMOS semiconductor fins may adversely affect the performance of the device.

Based on the investigation to the limitations of conventional manufacturing methods, this inventive concept presents an innovative solution that reduces the amount of a dopant of an anti-punch-through ion implantation diffused into the STI, and thus reduces the chance of the dopant diffusing into other semiconductor fins.

SUMMARY

Based on the investigation to the limitations of conventional manufacturing methods, this inventive concept presents an innovative solution that remedies at least some of those limitations.

This inventive concept presents a semiconductor device manufacturing method, comprising: providing a semiconductor structure, comprising:
 a substrate;
 a plurality of semiconductor fins on the substrate;
 a plurality of trenches surrounding the semiconductor fins; and
 a first insulation layer filling the trenches, wherein the plurality of semiconductor fins comprises a first semiconductor fin for a first device and a second semiconductor fin for a second device;
 conducting a first doping process in the first semiconductor fin to form a first anti-punch-through region therein;
 removing at least a portion of the first insulation layer so that at least a portion of the trenches is no longer filled by the first insulation layer;
 forming a second insulation filling the portion of the trenches not filled by the first insulation layer; and
 conducting a second doping process in the second semiconductor fin to form a second anti-punch-through region therein.

Additionally, in the aforementioned method, in providing the semiconductor structure, the semiconductor structure may further comprise:
 a hard mask layer on the semiconductor fins, wherein an upper surface of the first insulation layer is on the same horizontal level with an upper surface of the hard mask layer,
 and the first doping process is conducted in the first semiconductor find through the hard mask layer.

Additionally, in the aforementioned method, the first doping process may be a first ion implantation, and the second doping process may be a second ion implantation.

Additionally, in the aforementioned method, the first device may be a N-type Metal-Oxide-Semiconductor (NMOS) device, and the second device may be a P-type Metal-Oxide-Semiconductor (PMOS) device,
 the conditions under which the first ion implantation is conducted may include: an implanted ion is a P-type dopant, an implantation energy is in a range of 10 keV to 20 keV, and an implantation dose is in a range of $1.0 \times 10^{13}$ atom/cm$^2$ to $4.0 \times 10^{14}$ atom/cm$^2$,
 and the conditions under which the second ion implantation is conducted may include: an implanted ion is a N-type dopant, an implantation energy is in a range of 35 keV to 120 keV, and an implantation dose is in a range of $1.0 \times 10^{13}$ atom/cm$^2$ to $5.0 \times 10^{14}$ atom/cm$^2$.

Additionally, in the aforementioned method, conducting the first doping process in the first semiconductor fin through the hard mask layer may comprise:
 forming a patterned first mask layer on the semiconductor structure after the first insulation is formed, wherein the first mask layer exposes a portion of the hard mask layer on the first semiconductor fin;
 through the exposed portion of the hard mask layer, conducting the first doping process in the first semiconductor fin to form a first anti-punch-through region in the first semiconductor fin; and
 removing the first mask layer.

Additionally, in the aforementioned method, when forming the second insulation layer, the second insulation may cover the semiconductor fins and the hard mask layer,
 and conducting a second doping process in the second semiconductor fin may comprise:
 forming a patterned second mask layer on the semiconductor structure after the second insulation layer is formed, wherein the second mask layer exposes a portion of the second insulation layer on the second semiconductor fin;
 through the exposed portion of the second insulation layer and a portion of hard mask layer underneath, conducting the second doping process in the second semiconductor fin to form a second anti-punch-through region in the second semiconductor fin; and
 removing the second mask layer.

Additionally, in the aforementioned method, after the second insulation layer is formed, the second insulation layer and the first insulation layer may together constitute a trench insulation layer filling the trenches, and the aforementioned method may further comprise:

after the second anti-punch-through region is formed, removing a portion of the trench insulation layer to expose a portion of the semiconductor fins, and the height of the exposed portion of the semiconductor fins equals to a target height.

Additionally, in the aforementioned method, after a portion of the trench insulation layer is removed, the first anti-punch-through region and the second anti-punch-through region may both be lower than an upper surface of the remaining trench insulation layer.

Additionally, in the aforementioned method, a vertical distance from the first anti-punch-through region or the second anti-punch-through region to the upper surface of the remaining trench insulation layer may be in a range of 50 Å to 300 Å.

Additionally, the aforementioned method may further comprise:

applying an annealing treatment on the semiconductor structure after the second anti-punch-through region is formed, the annealing treatment may be a rapid thermal annealing process, a temperature for the rapid thermal annealing process may be in a range of 950° C. to 1100° C., and a processing time for the rapid thermal annealing process may be less than 30 seconds.

Additionally, the aforementioned method may further comprise:

removing the hard mask layer after the annealing treatment.

BRIEF DESCRIPTION OF THE DRAWINGS

The drawings illustrate some embodiments of this inventive concept and will be used to describe this inventive concept along with the specification.

Dash lines in the drawings, such as those in FIG. 3, are for illustration purpose only and do not represent any actual structural component.

DETAILED DESCRIPTION OF THE EMBODIMENTS

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIGS. 1A, 1B, 1C, 1D, and 1E show schematic sectional views illustrating different stages of an anti-punch-through ion implantation in a semiconductor fin in a conventional semiconductor device manufacturing method.

Figure 1A:
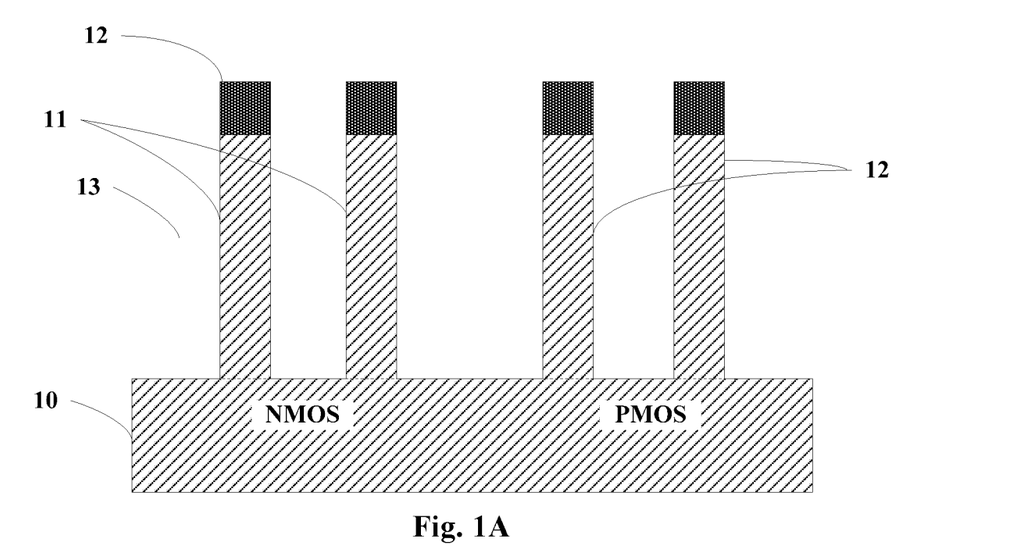
FIGS. 1A, 1B, 1C, 1D, and 1E show schematic sectional views illustrating different stages of an anti-punch-through ion implantation in a semiconductor fin in a conventional semiconductor device manufacturing method.

In a conventional method, as shown in FIG. 1A, a plurality of semiconductor fins is first formed in the substrate 10 through an etching process, these semiconductor fins may comprise a first semiconductor fin 11 for a NMOS device and a second semiconductor fin 12 for a PMOS device. The semiconductor fins are surrounded by a plurality of trenches 13. When forming the semiconductor fins, a hard mask layer may be formed on the semiconductor fins.

Figure 1B:
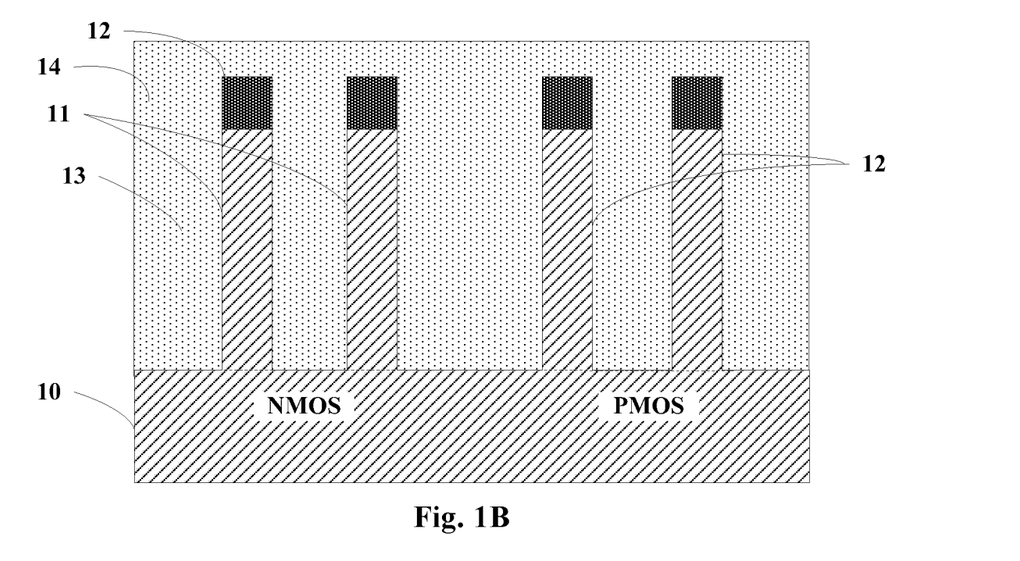

Next, referring to FIG. 1B, a trench insulation layer 14 filling the trenches 13 is deposited, then a Chemical Mechanical Planarization (CMP) process is conducted on the trench insulation layer 14.

Figure 1C:
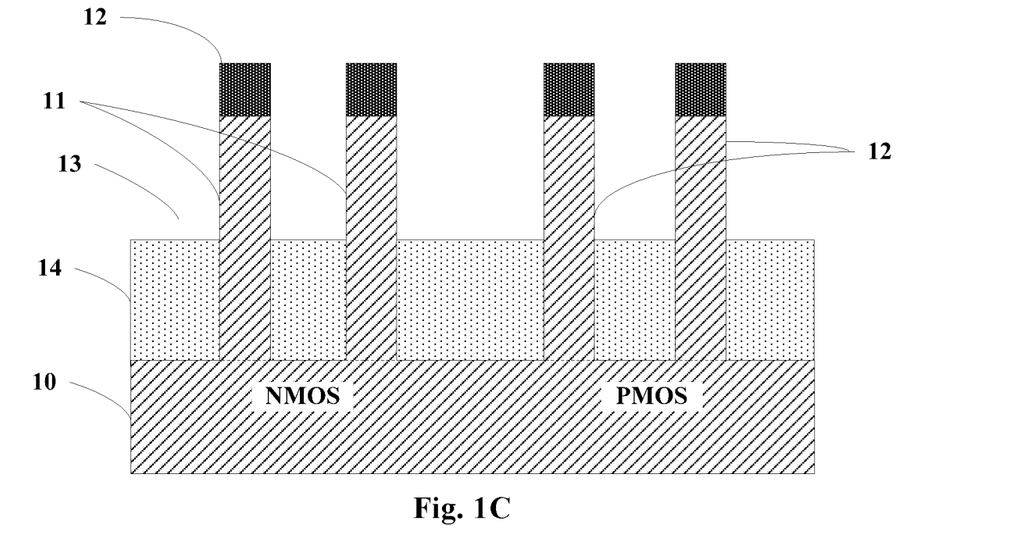

Next, referring to FIG. 1C, the trench insulation layer 14 is etched to expose a portion of the semiconductor fins. The hard mask layer may remain on the semiconductor fins in this step, and the trenches 13 and the trench insulation layer 14 work as Shallow Trench Isolation (STI).

Figure 1D:
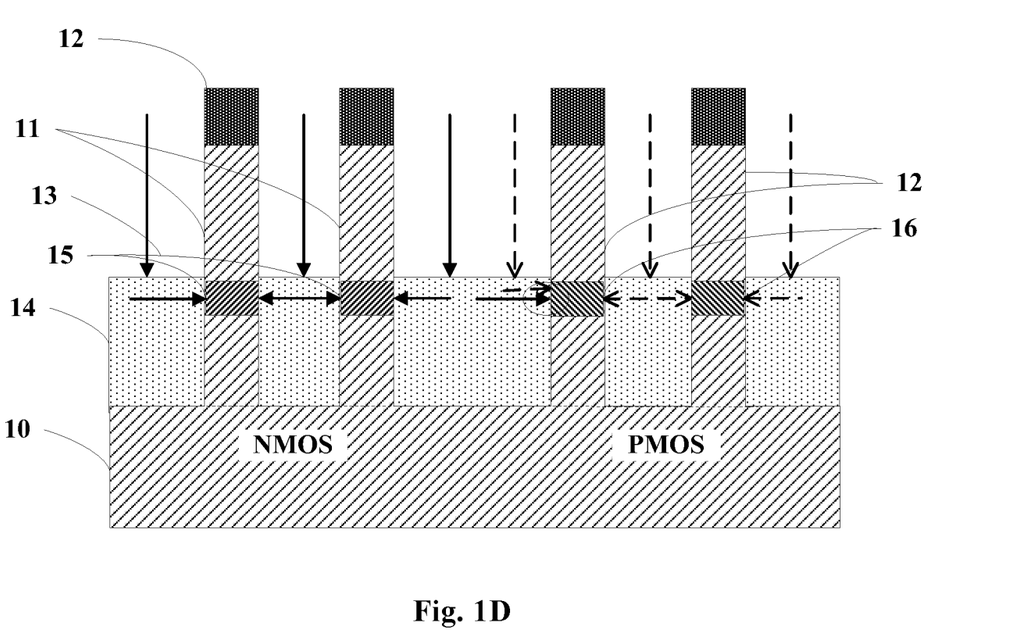

Next, referring to FIG. 1D, an anti-punch-through ion implantation (also known as channel stop injection) is conducted in the portion of the trench insulation layer 14 near the first semiconductor fin 11 and the second semiconductor fin 12. For example, boron (B) ions may be implanted into a portion of the trench insulation layer 14 near the first semiconductor fin 11, and arsenic (As) ions may be implanted into a portion of the trench insulation layer 14 near the second semiconductor fin 12. The ions implanted into the trench insulation layer 14 by the anti-punch-through ion implantation may laterally diffuse into the semiconductor fins and form anti-punch-through regions therein. For example, a first anti-punch-through region 15 may be formed in the first semiconductor fin 11, and a second anti-punch-through region 16 may be formed in the second semiconductor fin 12.

To compensate for the loss of boron ions during the anti-punch-through ion implantation, the anti-punch-through ion implantation in a NMOS region is conducted in a deeper location than that in a PMOS region. Because of a deeper ion implantation in a NMOS region than that in a PMOS region, the boron ions that are implanted into the trench insulation layer at the NMOS/PMOS boundary may diffuse to the second semiconductor fin 12, as shown in the circled region in FIG. 1D.

Figure 1E:
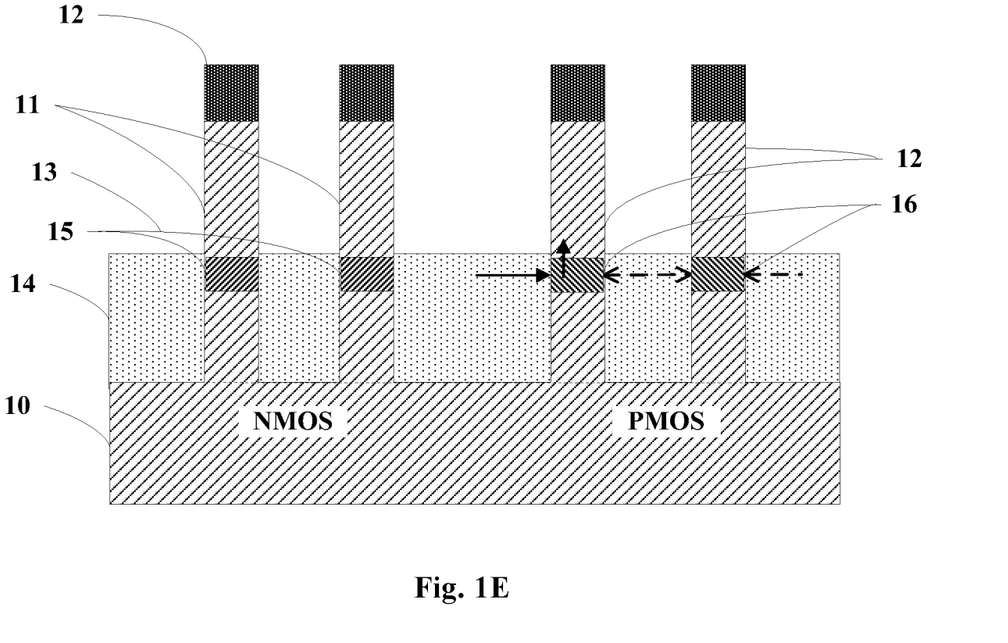

Next, referring to FIG. 1E, an annealing treatment is applied. After the annealing treatment, the boron ions diffused into the second semiconductor fin 12 may become doped in the second semiconductor fin 12, as shown in FIG. 1E. The doped boron ions may change a threshold voltage ($V_t$) and a saturation current ($I_{sat}$) of a PMOS device, which may be used as a pull up transistor in a Static Random Access Memory (SRAM), these changes may cause mismatch on the threshold voltage ($V_t$) and the saturation current ($I_{sat}$) between the PMOS device and its neighboring device, and thus adversely affect the performance of the device.

Figure 2:
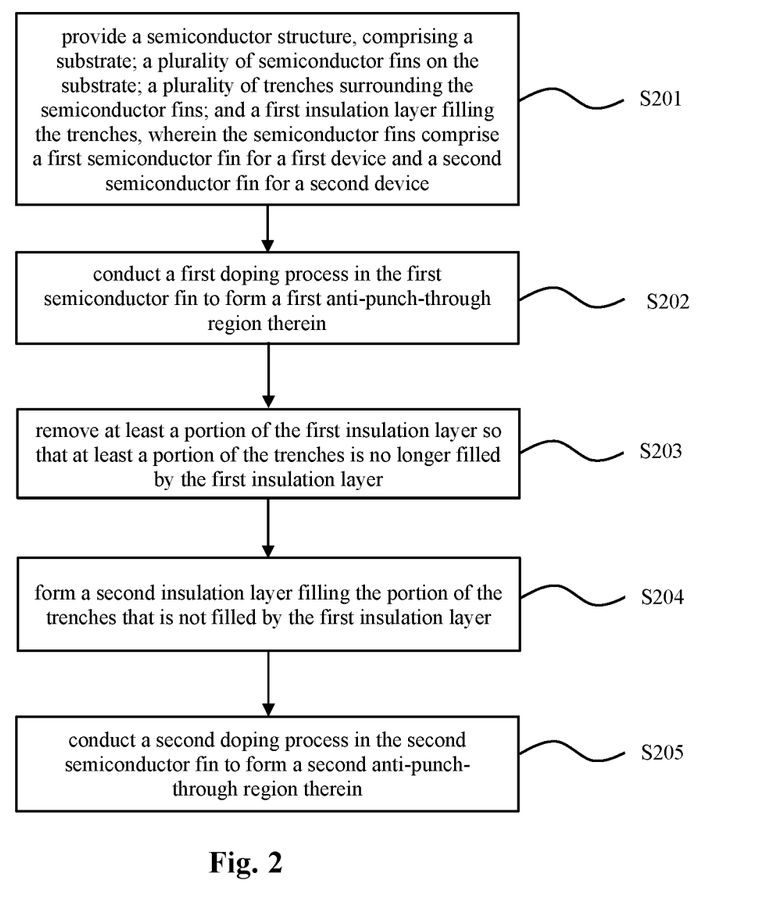
FIG. 2 shows a flowchart illustrating a semiconductor device manufacturing method in accordance with one embodiment of the inventive concept.

FIG. 2 shows a flowchart illustrating a semiconductor device manufacturing method in accordance with one embodiment of the inventive concept. FIGS. 3, 4, 5, 6, 7, 8, 9, 10, 11, 12, 13, and 14 show schematic sectional views illustrating different stages of this semiconductor device manufacturing method. This semiconductor device manufacturing method is described below with reference to these drawings.

Referring to FIG. 2, in step S201, a semiconductor structure is provided. The semiconductor structure may comprise a substrate, a plurality of semiconductor fins on the substrate, a plurality of trenches surrounding the semiconductor fins, and a first insulation layer covering the trenches. The plurality of semiconductor fins may comprise a first semiconductor fin for a first device and a second semiconductor fin for a second device.

In one embodiment, in providing the semiconductor structure, the semiconductor structure may further comprise a hard mask layer on the semiconductor fins, and an upper surface of the first insulation layer is on the same horizontal level with an upper surface of the hard mask layer.

The process to provide to semiconductor structure is described below in details with reference to FIGS. 3, 4, and 5.

Figure 3:
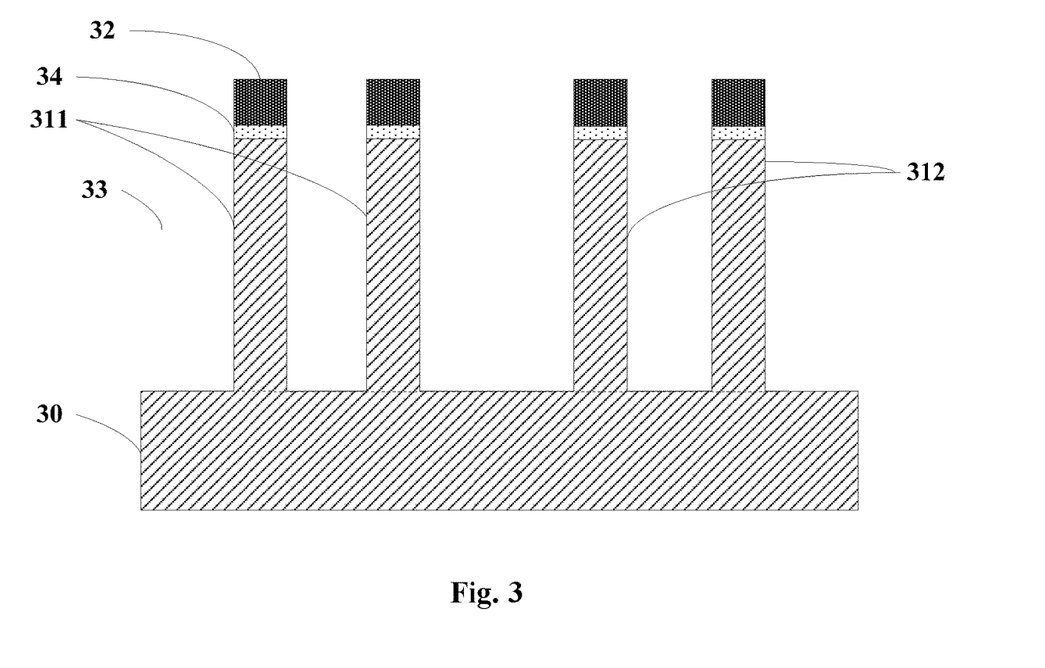
FIGS. 3, 4, 5, 6, 7, 8, 9, 10, 11, 12, 13, and 14 show schematic sectional views illustrating different stages of a semiconductor device manufacturing method in accordance with one embodiment of this inventive concept.

Referring to FIG. 3, an initial structure is first provided. The initial structure may comprise a substrate 30 (e.g., a silicon substrate) and a plurality of semiconductor fins (e.g., silicon) on the substrate 30. The plurality of semiconductor fins may comprise a first semiconductor fin 311 for a first device (e.g., a NMOS device) and a second semiconductor fin 312 for a second device (e.g., a PMOS device). The initial structure may further comprise a hard mask layer 32 (e.g., silicon nitride) on the semiconductor fins and a plurality of trenches 33 surrounding the semiconductor fins, with neighboring semiconductor fins being separated by the trenches 33. Optionally, as shown in FIG. 3, the initial structure may further comprise a buffer layer 34 located between the hard mask layer 32 and the semiconductor fins, the buffer layer 34 may be made of silicon dioxide.

Figure 4:
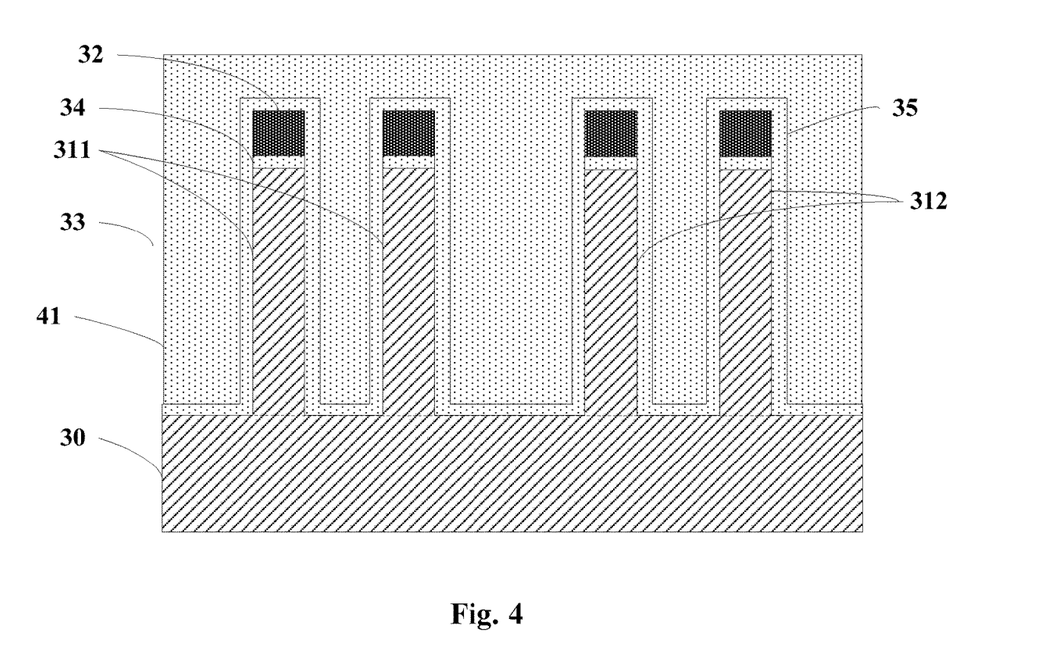

Next, referring to FIG. 4, the first insulation layer 41 (e.g., silicon dioxide) filling the trenches 33 may be formed through a deposition process. Optionally, before the first insulation layer 41 is formed, a deposition liner layer 35, which may be made of silicon dioxide, may be formed on the initial structure shown in FIG. 3, then the first insulation layer 41 filling the trenches 33 may be formed on the deposition liner layer 35 through a Flowable Chemical Vapor Deposition (FCVD) process.

Figure 5:
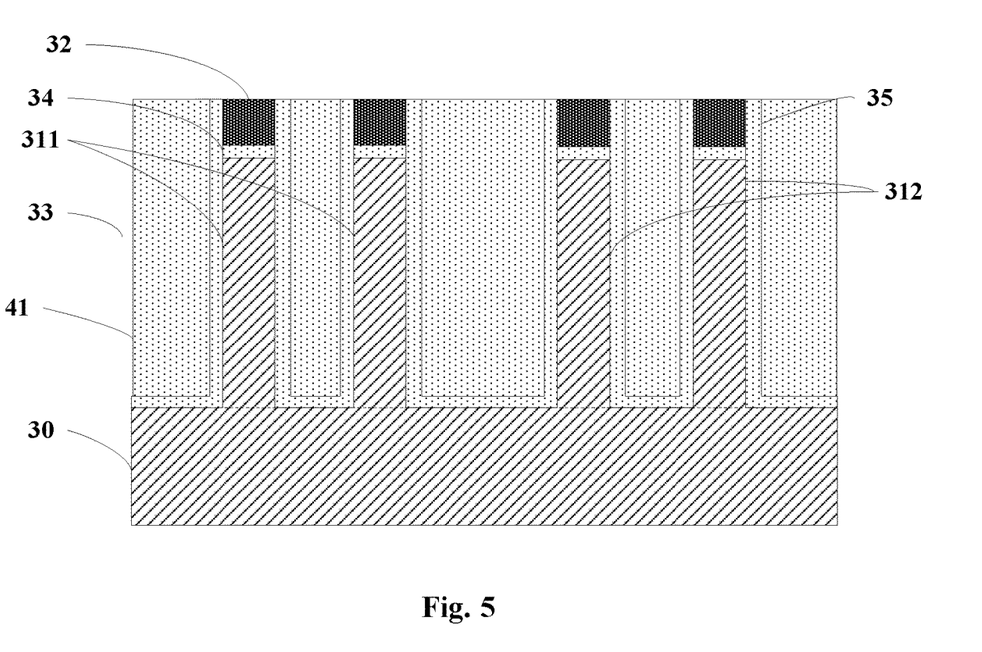

Next, referring to FIG. 5, an etch-back process or a planarization process (e.g., a CMP process) is applied on the first insulation layer 41 to make an upper surface of the first insulation layer 41 on the same horizontal level with an upper surface of the hard mask layer 32, that is, the upper surface of the hard mask layer 32 become exposed. It should be understood that, as used herein, "on the same horizontal level" does not necessary require two surfaces to be on exactly same level with zero deviation. For example, two surfaces may be considered "on the same horizontal level" if their vertical positions are within a certain tolerance range, such as less than 3 nm.

This concludes the description of the process to form a semiconductor structure in accordance with one embodiment of this inventive concept. As shown in FIG. 5, the semiconductor structure may comprise a substrate 30, a plurality of semiconductor fins on the substrate 30, a plurality of trenches 33 surrounding the semiconductor fins, and a first insulation layer 41 filling the trenches 33. The plurality of semiconductor fins may comprise a first semiconductor fin 311 for a first device and a second semiconductor fin 312 for a second device. The semiconductor structure may further comprise a hard mask layer 32 on the semiconductor fins, with the upper surface of the first insulation layer 41 on the same horizontal level with the upper surface of the hard mask layer 32. Optionally, as shown in FIG. 5, the semiconductor structure may further comprise a buffer layer 34 located between the semiconductor fins and the hard mask layer 32.

Next, back to FIG. 2, in step 202, a first doping process is conducted in the first semiconductor fin to form a first anti-punch-through therein, the first doping process may be a first ion implantation.

In one embodiment, the first doping process may be conducted in the first semiconductor fin through the hard mask layer 32, this process is described below in details with reference to FIGS. 6 and 7.

Figure 6:
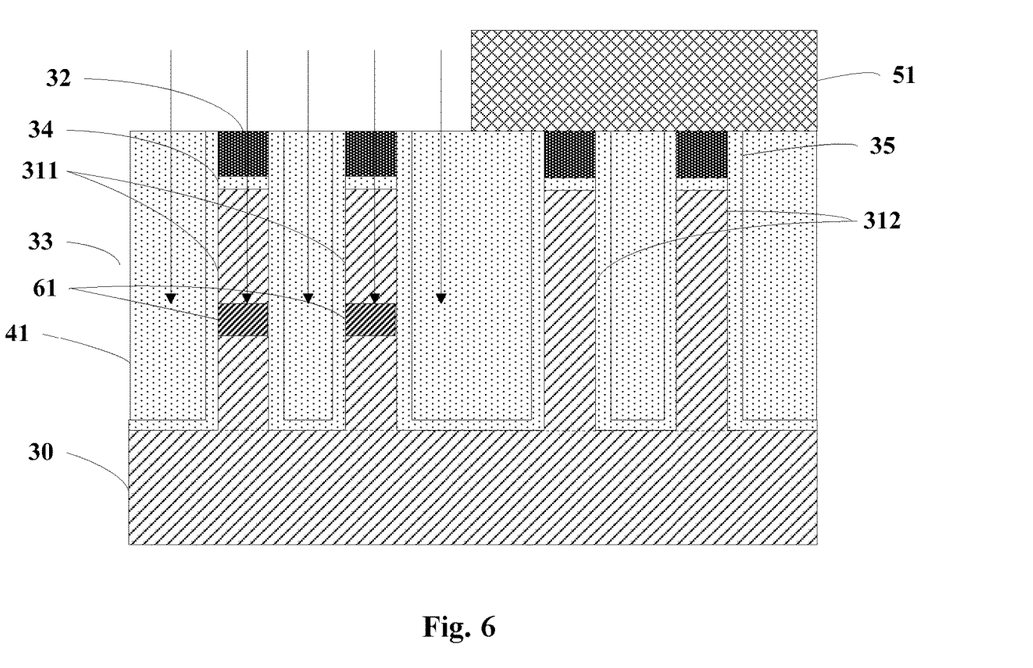

Referring to FIG. 6, a patterned first mask layer 51 (e.g., a photoresist) may be formed on the semiconductor structure after the first insulation layer 41 is formed, the first mask layer 51 exposes a portion of the hard mask layer 32 on the first semiconductor fin 311.

Next, referring to FIG. 6, the first doping process (e.g., the first ion implantation) is conducted in the first semiconductor fin 311 through the exposed portion of the hard mask layer 32 to form a first anti-punch-through region 61 in the first semiconductor fin 311.

If the first device is a NMOS device (i.e., the first semiconductor fin 311 is for a NMOS device), the first ion implantation may be conducted under the following conditions: an implanted ion is a P-type dopant (e.g., boron-containing ions such as boron ions or boron difluoride ions), an implantation energy is in a range of 10 keV to 20 keV (e.g., 15 keV), and an implantation dose is in a range of $1.0 \times 10^{13}$ atom/cm$^2$ to $4.0 \times 10^{14}$ atom/cm$^2$ (e.g., $5.0 \times 10^{13}$ atom/cm$^2$, $1.0 \times 10^{14}$ atom/cm$^2$, or $2.0 \times 10^{14}$ atom/cm$^2$).

Figure 7:
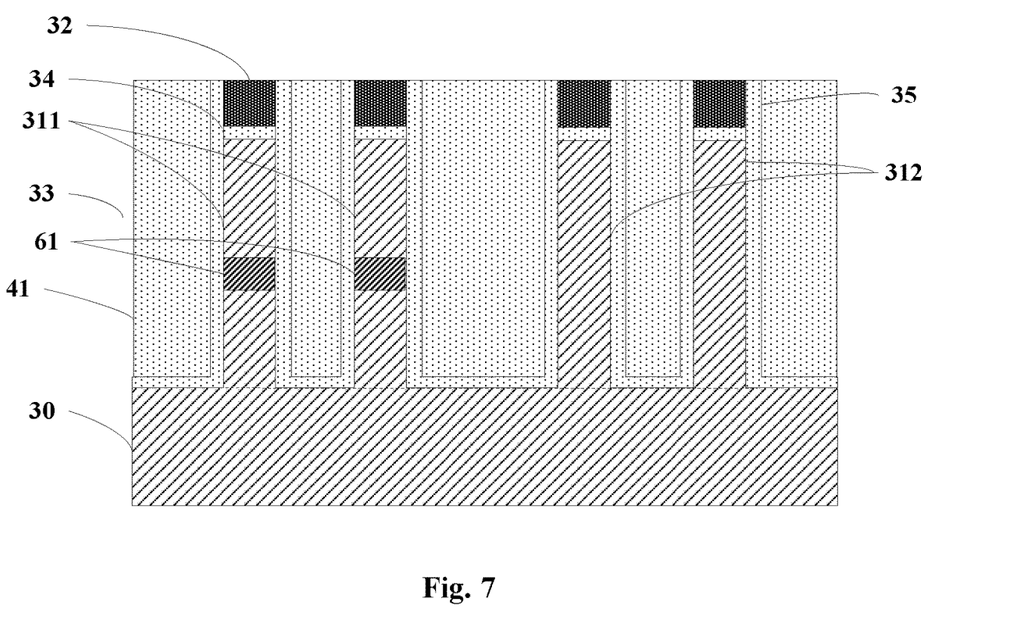

Next, referring to FIG. 7, the first mask layer 51 is removed. This concludes the process of conducting a first doping process in the first semiconductor fin through the hard mask layer 32. In some embodiments, when conducting the first doping process, some P-type dopant may be doped into the first insulation layer 41.

Back to FIG. 2, in step S203, after the first anti-punch-through region 61 is formed in the first semiconductor fin 311, at least a portion of the first insulation layer 41 is removed so that at least a portion of the trenches 33 is no longer filled by the first insulation layer 41.

Figure 8:
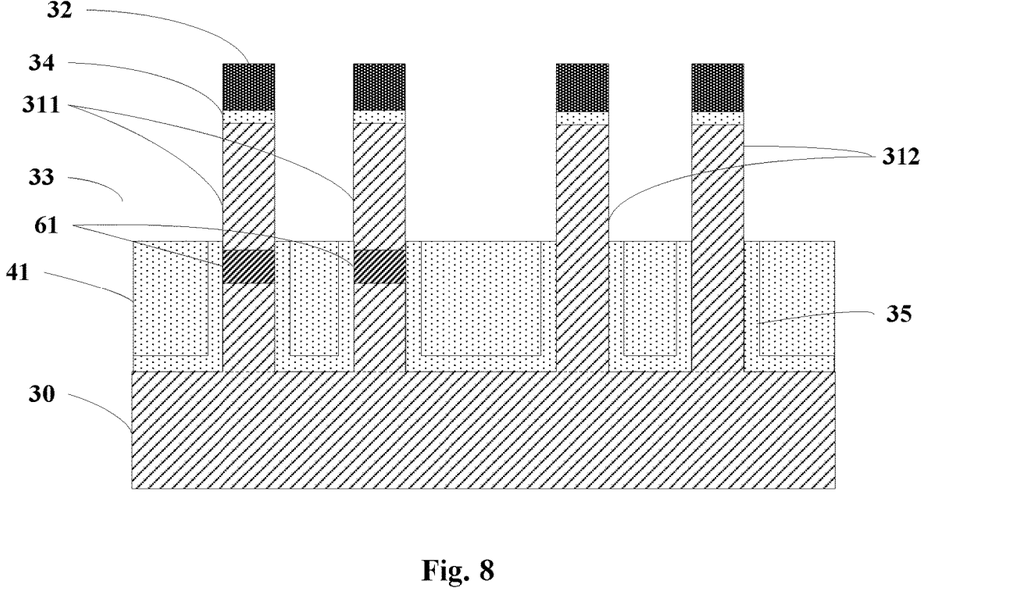

FIG. 8 shows a schematic sectional view of the semiconductor structure after step S203. As shown in FIG. 8, a portion of the first insulation layer 41 may be removed by an etching process to expose a portion of the semiconductor fins (e.g., the first semiconductor fin 311 and the second semiconductor fin 312). The remaining first insulation layer 41 may still partially fill the trenches 33, but at least a portion of the trenches 33 is no longer filled by the first insulation layer 41. The removed portion of the first insulation layer 41 may have a thickness in a range of 400 Å to 700 Å (e.g., 500 Å or 600 Å), which is the portion of the first insulation layer 41 that comprise the majority of the P-type dopant doped into the first insulation layer 41. In some embodiments, the first insulation layer 41 may be completely removed, in that case all the P-type dopant doped into the first insulation layer 41 is removed along with the first insulation layer 41. Optionally, when removing a portion of the first insulation layer 41, a portion of the deposition liner layer 35 may also be removed. In this embodiment, at least a portion of the first insulation layer 41 is removed, and a portion of the P-type dopant doped into the first insulation layer 41 is also removed along with the first insulation layer 41, thus the chance of the P-type dopant diffusing into the second semiconductor fin is reduced.

Back to FIG. 2, in step S204, a second insulation layer is formed filling the portion of the trenches 33 that are not filled by the first insulation layer 41.

Figure 9:
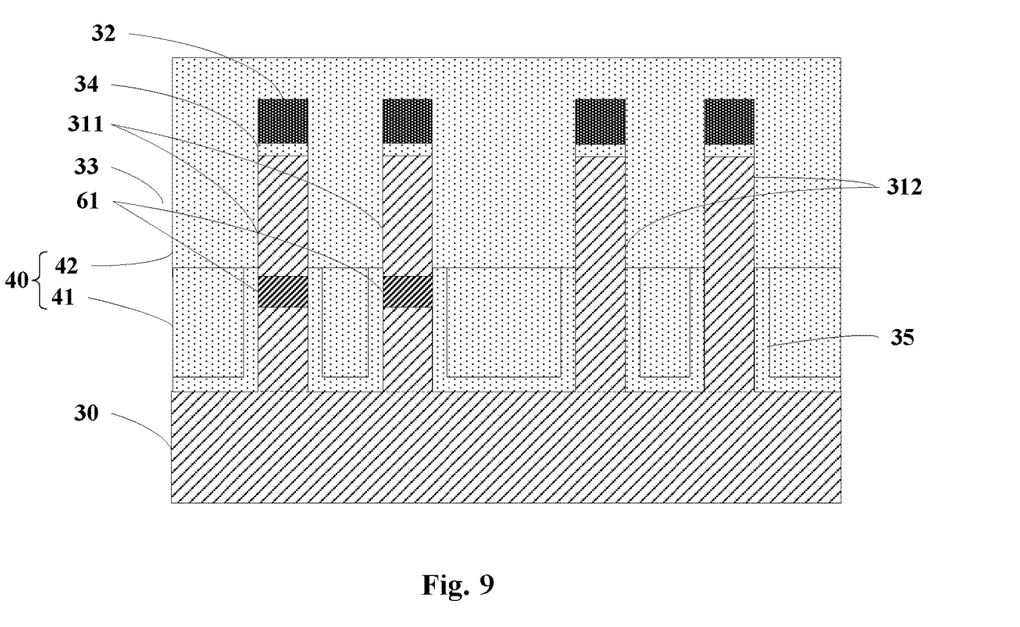

FIG. 9 shows a schematic sectional view of the semiconductor structure after step S204. As shown in FIG. 9, the second insulation layer 42 may be formed through a deposition process and filling the portion of the trenches not filled by the first insulation layer 41. The second insulation layer 42 may also cover the semiconductor fins (including the first semiconductor fin 311 and the second semiconductor fin 312) and the hard mask layer 32. The second insulation layer 42 may be made of silicon dioxide. The second insulation layer 42 may comprise silicon dioxide deposited through a High Aspect Ratio Process (HARP) deposition or a High Density Plasma (HDP) chemical vapor deposition. Compared to silicon dioxide deposited by other deposition methods, silicon dioxide deposited by HARP deposition or HDP chemical vapor deposition has a better filling capability.

Optionally, after the second insulation layer 42 is formed, a planarization process may be conducted on the second insulation layer 42.

Figure 11:
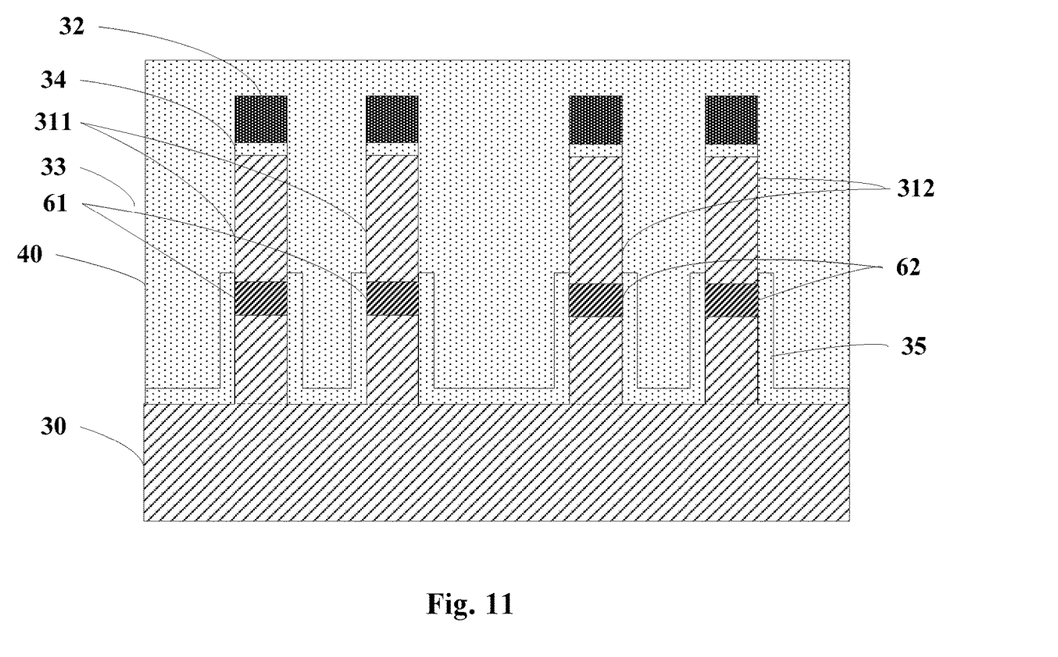

In the embodiments of this inventive concept, for the ease of description, the second insulation layer 42 and the first insulation layer 41 together may be designated as a trench insulation layer 40, as shown in FIG. 11.

Back to FIG. 2, in step S205, after the second insulation layer 42 is formed, a second doping process is conducted in the second semiconductor fin 312 to form a second anti-punch-through region therein. The second doping process may be a second ion implantation.

The detail procedures of the second doping process in the second semiconductor fin 312 are described below with reference to FIGS. 10 and 11.

Figure 10:
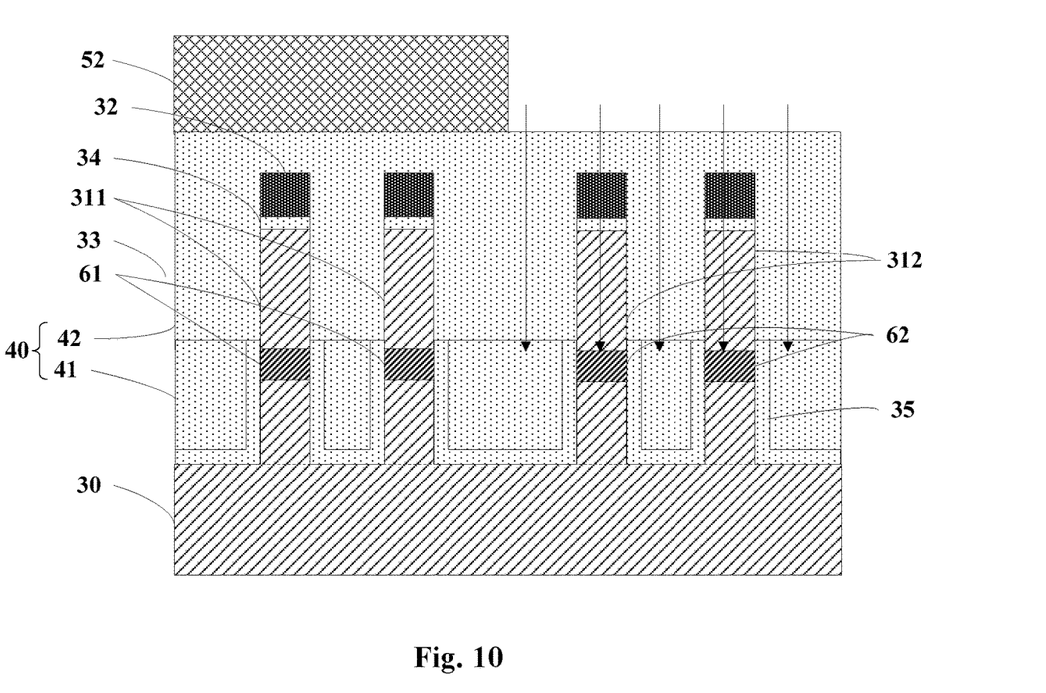

Referring to FIG. 10, after the second insulation layer 42 is formed, a patterned second mask layer 52 (e.g., a photoresist) is formed on the semiconductor structure, with the second mask layer 52 exposing a portion of the second insulation layer 42 on the second semiconductor fin 312.

Next, referring to FIG. 10, through the exposed portion of the second insulation layer 42 and the hard mask layer 32 underneath, a second doping process (e.g., the second ion implantation) may be conducted in the second semiconductor fin 312 to form a second anti-punch-through region 62 in the second semiconductor fin 312.

If the second device is a PMOS device (i.e., the second semiconductor fin 312 is for a PMOS device), the second ion implantation may be conducted under the following conditions: an implanted ion is a N-type dopant (e.g., phosphorus-containing ions or arsenic-containing ions, such as phosphorus ion or arsenic ion), an implantation energy is in a range of 35 keV to 120 keV (e.g., 50 keV or 100 keV), and an implantation dose is in a range of $1.0 \times 10^{13}$ atom/cm$^2$ to $5.0 \times 10^{14}$ atom/cm$^2$ (e.g., $5.0 \times 10^{13}$ atom/cm$^2$, $1.0 \times 10^{14}$ atom/cm$^2$, or $3.0 \times 10^{14}$ atom/cm$^2$).

Next, referring to FIG. 11, the second mask layer 52 is removed. This concludes the second doping process conducted in the second semiconductor fin 312.

This concludes the description of a semiconductor device manufacturing method in accordance with one embodiment of this inventive concept. In this manufacturing method, after a first doping process is conducted in the first semiconductor fin to form a first anti-punch-through region therein, at least a portion of the first insulation layer is removed so that at least a portion of the trenches is no longer filled by the first insulation layer. After that, a second insulation layer is formed to fill the unfilled portion of the trenches, and a second doping process is conducted in the second semiconductor fin to form a second anti-punch-through region therein. By removing at least a portion of the first insulation layer, at least some of the first dopant (e.g., a P-type dopant) diffused into the first insulation layer during the first doping process is also removed, that reduces the chance of the dopant diffusing into the second semiconductor fin and thus improves the performance of the device.

Figure 12:
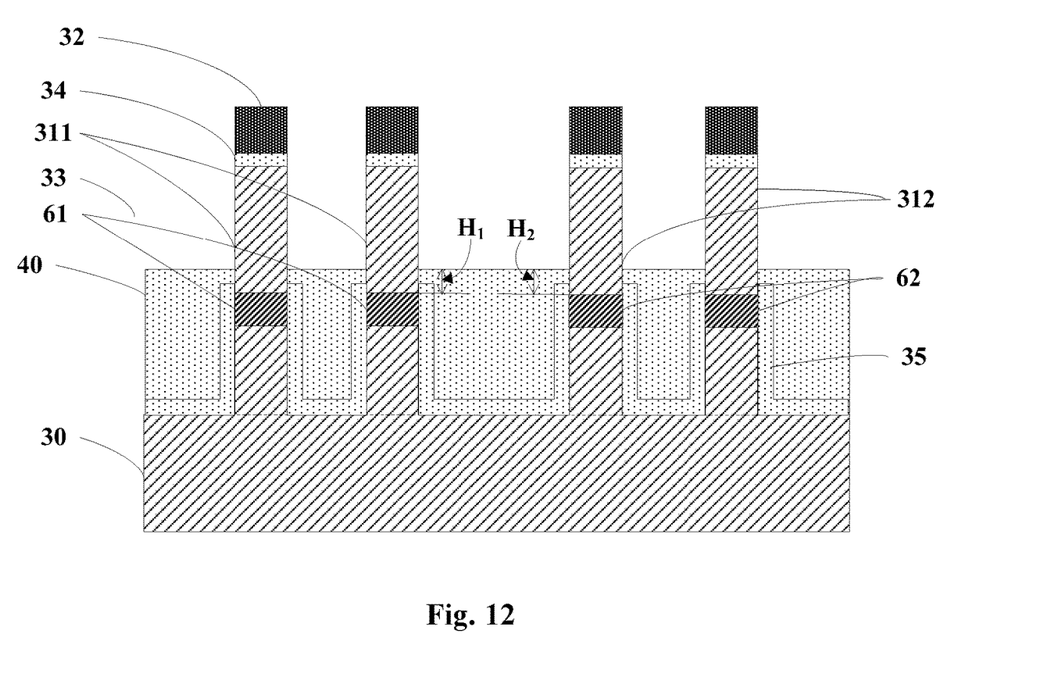

Referring to FIG. 12, in some embodiments, the manufacturing method of this inventive concept may further comprise removing a portion of the trench insulation layer 40 after the second anti-punch-through region is formed so that the height of the exposed portion of the semiconductor fins equals to a target height.

In one embodiment, after a portion of the trench insulation layer 40 is removed, the first anti-punch-through region 61 and the second anti-punch-through region 62 are both lower than an upper surface of the remaining trench insulation layer 40. A vertical distance from the first anti-punch-through region 61 or the second anti-punch-through region 62 to an upper surface of the remaining trench insulation layer 40 may be in a range of 50 Å to 300 Å. That is, a vertical distance $H_1$ between the first anti-punch-through region 61 and the upper surface of the remaining trench insulation layer 40 may be in a range of 50 Å to 300 Å (e.g., 100 Å or 200 Å), and a vertical distance $H_2$ between the second anti-punch-through region 62 and the upper surface of the remaining trench insulation layer 40 may also be in a range of 50 Å to 300 Å (e.g., 100 Å or 200 Å), as shown in FIG. 12. In this embodiment, in the manufacturing method in accordance with this inventive concept, the first anti-punch-through region 61 and the second anti-punch-through 62 may have a similar vertical distance to the upper surface of the remaining trench insulation layer 40, while in conventional methods, the anti-punch-through region in NMOS region need to be implanted deeper than its counterpart in PMOS region.

Figure 13:
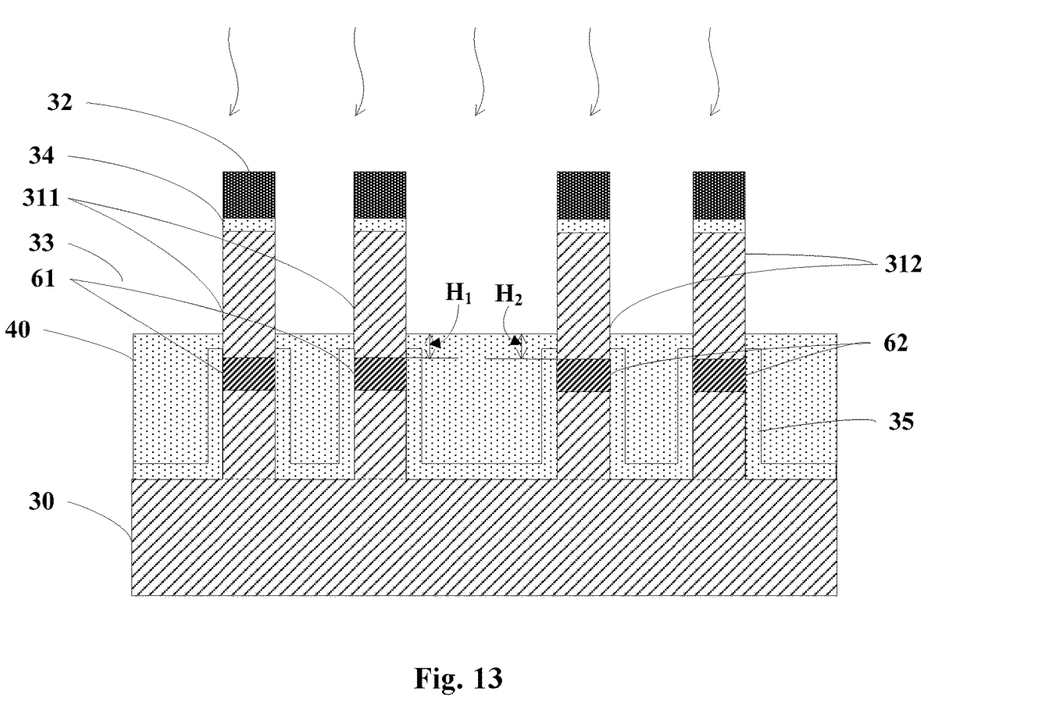

Referring to FIG. 13, in some embodiments, the manufacturing method of this inventive concept may further comprise applying an annealing treatment on the semiconductor structure after the second anti-punch-through 62 is formed. For example, the annealing treatment may be a Rapid Thermal Annealing (RTA) process. In one embodiment, a temperature for the RTA process may be in a range of 950° C. to 1100° C. (e.g., 1000° C.), and a processing time for the RTA process may be less than 30 seconds (e.g., 10 seconds or 20 seconds). The annealing treatment may activate the dopant in the anti-punch-through regions and cause its diffusion to other regions. When conducting the first doping process, a portion of the first dopant may laterally diffuse into the first insulation layer 41 in the trenches 33. Since a portion of the first insulation layer 41 is removed before the second insulation layer is formed, the first dopant diffused to that portion of the first semiconductor layer 41 is also removed, that reduces the chance of the first dopant diffusing into the second semiconductor fin due to the annealing treatment.

Figure 14:
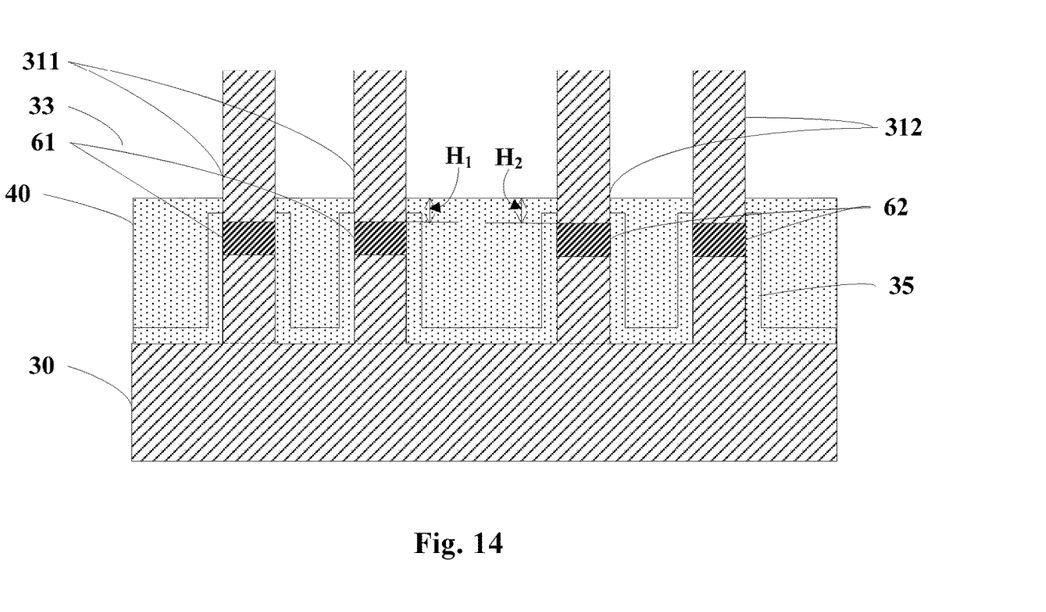

Referring to FIG. 14, in some embodiments, this manufacturing method of this inventive concept may further comprise removing the hard mask layer 32 after the annealing treatment, the buffer layer 34 may also be removed after the hard mask layer 32 is removed.

This concludes the description of a semiconductor device manufacturing method in accordance with one or more embodiments of this inventive concept.

In this manufacturing method, after the first anti-punch-through region is formed in the first semiconductor fin, at least a portion of the first insulation layer is removed so that at least a portion of the trenches is no longer filled by the first insulation layer, then a second insulation layer is formed to fill the unfilled portion of the trenches, then a second doping process is conducted in the second semiconductor fin to form a second anti-punch-through region therein. By removing at least a portion of the first insulation layer, at least some of the first dopant (e.g., a P-type dopant) diffused into the first insulation layer during the first doping process is also removed, that reduces the chance of the first dopant (e.g., a P-type dopant) diffusing into the second semiconductor fin due to the annealing treatment, the reduction in the diffusion ameliorates the mismatch of the threshold voltages ($V_t$) and the saturation current ($I_{sat}$) among the semiconductor devices (e.g., pull up transistors in the SRAM devices), and thus improves the performance of the devices.

This concludes the description of a semiconductor device manufacturing method in accordance with one or more embodiments of this inventive concept. For the purpose of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A semiconductor device manufacturing method, comprising:
    providing a semiconductor structure, comprising: a substrate; a plurality of semiconductor fins on the substrate; a plurality of trenches surrounding the semiconductor fins; and a first insulation layer filling the trenches, wherein the plurality of semiconductor fins comprises a first semiconductor fin for a first device and a second semiconductor fin for a second device;
    conducting a first doping process in the first semiconductor fin to form a first anti-punch-through region therein;
    removing at least a removed portion of the first insulation layer so that at least a portion of the trenches is no longer filled by the first insulation layer and so that a remaining portion of the first insulation layer remains in the trenches and is positioned closer to the substrate than the first anti-punch-through region;
    forming a second insulation layer filling the portion of the trenches not filled by the first insulation layer; and
    when both the second insulation layer and the remaining portion of the first insulation layer are positioned in the trenches, conducting a second doping process in the second semiconductor fin to form a second anti-punch-through region therein.

2. The method of claim 1, wherein in providing the semiconductor structure, the semiconductor structure further comprises:
    a hard mask layer on the semiconductor fins, wherein an upper surface of the first insulation layer is on the same horizontal level with an upper surface of the hard mask layer, and wherein the first doping process is conducted in the first semiconductor find through the hard mask layer.

3. The method of claim 2, wherein conducting the first doping process in the first semiconductor fin through the hard mask layer comprises:
    forming a patterned first mask layer on the semiconductor structure after the first insulation is formed, wherein the first mask layer exposes a portion of the hard mask layer on the first semiconductor fin;
    through the exposed portion of the hard mask layer, conducting the first doping process in the first semiconductor fin to form a first anti-punch-through region in the first semiconductor fin; and
    removing the first mask layer.

4. The method of claim 2, wherein when forming the second insulation layer, the second insulation covers the semiconductor fins and the hard mask layer, and
    wherein conducting a second doping process in the second semiconductor fin comprises:
        forming a patterned second mask layer on the semiconductor structure after the second insulation layer is formed, wherein the second mask layer exposes a portion of the second insulation layer on the second semiconductor fin;
        through the exposed portion of the second insulation layer and a portion of hard mask layer underneath, conducting the second doping process in the second semiconductor fin to form a second anti-punch-through region in the second semiconductor fin; and
        removing the second mask layer.

5. The method of claim 2, further comprising:
    applying an annealing treatment on the semiconductor structure after the second anti-punch-through region is formed.

6. The method of claim 5, wherein the annealing treatment is a rapid thermal annealing process.

7. The method of claim 6, wherein a temperature for the rapid thermal annealing process is in a range of 950° C. to 1100° C., and a processing time for the rapid thermal annealing process is less than 30 seconds.

8. The method of claim 5, further comprising:
    removing the hard mask layer after the annealing treatment.

9. The method of claim 1, wherein the first doping process is a first ion implantation, and the second doping process is a second ion implantation.

10. The method of claim 9, wherein the first device is an N-type Metal-Oxide-Semiconductor (NMOS) device, and the second device is a P-type Metal-Oxide-Semiconductor (PMOS) device,
    wherein the conditions under which the first ion implantation is conducted include: an implanted ion is a P-type dopant, an implantation energy is in a range of 10 keV to 20 keV, and an implantation dose is in a range of $1.0 \times 10^{13}$ atom/cm$^2$ to $4.0 \times 10^{14}$ atom/cm$^2$, and
    wherein the conditions under which the second ion implantation is conducted include: an implanted ion is an N-type dopant, an implantation energy is in a range of 35 keV to 120 keV, and an implantation dose is in a range of $1.0 \times 10^{13}$ atom/cm$^2$ to $5.0 \times 10^{14}$ atom/cm$^2$.

11. The method of claim 1, wherein after the second insulation layer is formed, the second insulation layer and the first insulation layer together constitute a trench insulation layer filling the trenches, and
    wherein the method of claim 1, further comprising:
        after the second anti-punch-through region is formed, removing a portion of the trench insulation layer to expose a portion of the semiconductor fins, and the height of the exposed portion of the semiconductor fins equals to a target height.

12. The method of claim 11, wherein after a portion of the trench insulation layer is removed, the first anti-punch-through region and the second anti-punch-through region are both lower than an upper surface of the remaining trench insulation layer.

13. The method of claim 12, wherein a vertical distance from the first anti-punch-through region or the second anti-punch-through region to the upper surface of the remaining trench insulation layer is in a range of 50 Å to 300 Å.

14. A semiconductor device manufacturing method, comprising:
    providing a semiconductor structure, comprising: a substrate; a plurality of semiconductor fins on the substrate; a plurality of trenches surrounding the semiconductor fins; and a first insulation layer filling the trenches, wherein the plurality of semiconductor fins comprises a first semiconductor fin for a first device and a second semiconductor fin for a second device;
    conducting a first doping process in the first semiconductor fin to form a first anti-punch-through region therein;
    removing at least a portion of the first insulation layer so that at least a portion of the trenches is no longer filled by the first insulation layer;
    forming a second insulation layer filling the portion of the trenches not filled by the first insulation layer; and conducting a second doping process in the second semiconductor fin to form a second anti-punch-through region therein, wherein the first doping process is a first ion implantation, and the second doping process is a second ion implantation, wherein the first device is an N-type Metal-Oxide-Semiconductor (NMOS) device, and the second device is a P-type Metal-Oxide-Semiconductor (PMOS) device, wherein the conditions under which the first ion implantation is conducted include: an implanted ion is a P-type dopant, an implantation energy is in a range of 10 keV to 20 keV, and an implantation dose is in a range of $1.0 \times 10^{13}$ atom/cm$^2$ to $4.0 \times 10^{14}$ atom/cm$^2$, and wherein the conditions under which the second ion implantation is conducted include: an implanted ion is an N-type dopant, an implantation energy is in a range of 35 keV to 120 keV, and an implantation dose is in a range of $1.0 \times 10^{13}$ atom/cm$^2$ to $5.0 \times 10^{14}$ atom/cm$^2$.

15. A semiconductor device manufacturing method, comprising:

providing a semiconductor structure, comprising: a substrate; a plurality of semiconductor fins on the substrate; a plurality of trenches surrounding the semiconductor fins; and a first insulation layer filling the trenches, wherein the plurality of semiconductor fins comprises a first semiconductor fin for a first device and a second semiconductor fin for a second device;

conducting a first doping process in the first semiconductor fin to form a first anti-punch-through region therein;

removing at least a portion of the first insulation layer so that at least a portion of the trenches is no longer filled by the first insulation layer;

forming a second insulation layer filling the portion of the trenches not filled by the first insulation layer; and conducting a second doping process in the second semiconductor fin to form a second anti-punch-through region therein, wherein in providing the semiconductor structure, the semiconductor structure further comprises: a hard mask layer on the semiconductor fins, wherein an upper surface of the first insulation layer is on the same horizontal level with an upper surface of the hard mask layer, and wherein the first doping process is conducted in the first semiconductor find through the hard mask layer, wherein conducting the first doping process in the first semiconductor fin through the hard mask layer comprises: forming a patterned first mask layer on the semiconductor structure after the first insulation is formed, wherein the first mask layer exposes a portion of the hard mask layer on the first semiconductor fin; through the exposed portion of the hard mask layer, conducting the first doping process in the first semiconductor fin to form a first anti-punch-through region in the first semiconductor fin; and removing the first mask layer.

* * * * *